(12) United States Patent
Nguyen et al.

(10) Patent No.: US 10,224,875 B2
(45) Date of Patent: Mar. 5, 2019

(54) MICROMECHANICAL FREQUENCY DIVIDER

(71) Applicant: THE REGENTS OF THE UNIVERSITY OF CALIFORNIA, Oakland, CA (US)

(72) Inventors: Clark T.-C. Nguyen, Oakland, CA (US); Tristan O. Rocheleau, Berkeley, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 173 days.

(21) Appl. No.: 15/170,577

(22) Filed: Jun. 1, 2016

(65) Prior Publication Data

US 2017/0047893 A1 Feb. 16, 2017

Related U.S. Application Data

(63) Continuation of application No. PCT/US2014/068209, filed on Dec. 2, 2014.
(Continued)

(51) Int. Cl.
*H03B 19/14* (2006.01)
*H03L 7/18* (2006.01)
(Continued)

(52) U.S. Cl.
CPC ............. *H03B 19/14* (2013.01); *H03B 19/00* (2013.01); *H03H 9/02007* (2013.01);
(Continued)

(58) Field of Classification Search
CPC ........ H03H 9/2436; H03H 9/171; H03H 9/25; H03L 7/18; H03B 5/30; H03B 19/14
(Continued)

(56) References Cited

U.S. PATENT DOCUMENTS 7,023,065 B2   4/2006 Ayazi et al.
7,369,004 B2 * 5/2008 Partridge ................ G01K 7/32
                                                    331/116 M
(Continued)

OTHER PUBLICATIONS

Korean Intellectual Property Organization (KIPO), International Search Report and Written Opinion, PCT/US2014/068209, dated Sep. 14, 2015, pp. 1-14, with claims searched, pp. 15-28.

*Primary Examiner* — Arnold Kinkead
(74) *Attorney, Agent, or Firm* — O'Banion & Ritchey LLP; John P. O'Banion

(57) ABSTRACT

A micro-electromechanical system (MEMS) frequency divider apparatus having one or more MEMS resonators on a substrate is presented. A first oscillator frequency, as an approximate multiple of the parametric oscillation frequency, is capacitively coupled from a very closely-spaced electrode (e.g., 40 nm) to a resonant structure of the first oscillator, thus inducing mechanical oscillation. This mechanical oscillation can be coupled through additional MEMS resonators on the substrate. The mechanical resonance is then converted, in at least one of the MEMS resonators, by capacitive coupling back to an electrical signal which is a division of the first oscillation frequency. Output may be generated as a single ended output, or in response to a differential signal between two output electrodes.

24 Claims, 10 Drawing Sheets

Related U.S. Application Data

(60) Provisional application No. 61/910,916, filed on Dec. 2, 2013.

(51) Int. Cl.
　　*H03B 19/00*　　(2006.01)
　　*H03K 25/02*　　(2006.01)
　　*H03H 9/02*　　(2006.01)
　　*H03H 9/17*　　(2006.01)
　　*H03H 9/24*　　(2006.01)
　　*H03H 9/25*　　(2006.01)

(52) U.S. Cl.
　　CPC .......... *H03H 9/171* (2013.01); *H03H 9/2431* (2013.01); *H03H 9/2436* (2013.01); *H03H 9/2447* (2013.01); *H03H 9/25* (2013.01); *H03K 25/02* (2013.01); *H03L 7/18* (2013.01); *H03B 2200/0016* (2013.01)

(58) Field of Classification Search
　　USPC .............. 331/154, 116 M; 29/594; 257/416
　　See application file for complete search history.

(56) References Cited

U.S. PATENT DOCUMENTS

| | | | |
|---|---|---|---|
| 7,551,043 B2 | 6/2009 | Nguyen et al. | |
| 2003/0151446 A1* | 8/2003 | Lutwak | H03H 9/02259 327/416 |
| 2009/0206963 A1 | 8/2009 | Nguyen et al. | |
| 2010/0271088 A1 | 10/2010 | Namba et al. | |

* cited by examiner

MICROMECHANICAL FREQUENCY DIVIDER

CROSS-REFERENCE TO RELATED APPLICATIONS

This application is a 35 U.S.C. § 111(a) continuation of PCT international application number PCT/US2014/068209 filed on Dec. 2, 2014, incorporated herein by reference in its entirety, which claims priority to, and the benefit of, U.S. provisional patent application Ser. No. 61/910,916 filed on Dec. 2, 2013, incorporated herein by reference in its entirety. Priority is claimed to each of the foregoing applications.

The above-referenced PCT international application was published as PCT International Publication No. WO 2015/126498 on Aug. 27, 2015, which publication is incorporated herein by reference in its entirety.

STATEMENT REGARDING FEDERALLY SPONSORED RESEARCH OR DEVELOPMENT

This invention was made with Government support under FA9550-10-1-0293 awarded by the Defense Advanced Research Projects Agency (DARPA). The Government has certain rights in the invention.

INCORPORATION-BY-REFERENCE OF COMPUTER PROGRAM APPENDIX

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

BACKGROUND

1. Technological Field

This technical disclosure pertains generally to frequency dividers, and more particularly to a micromechanical frequency divider.

2. Background Discussion

Frequency dividers have become essential components in phase-locked loops (PLL), frequency synthesizers, and are otherwise used in myriad applications, from instrumentation to wireless handsets. In a typical frequency synthesizer application, frequency dividers often limit the achievable phase noise performance and contribute a large or even majority portion of the total power consumption. Common digital dividers offer acceptable noise performance, yet their operating power far exceeds what would be permissible for mobile applications. These dividers also provide poor scaling as frequency is increased, for example a power consumption of about 135 mW is typical for a low-noise divide-by-16 device operating at 3 GHz.

Injection-locked oscillator dividers, that lock a free running oscillator to an input signal at a harmonic of the oscillation frequency, have emerged as one possible solution providing a lower power option at high frequency. With operating power below 100 µW even at GHz frequencies, such dividers present a compelling alternative to traditional technologies. While these achievements are impressive, such dividers come at a cost to noise performance due to the active transistors used to sustain oscillation, and still fall short of µW power consumption desired for long-term battery operated applications.

Accordingly, a need exists for frequency division devices which can operate with low power consumption at high frequencies in the MHz to GHz range while adding minimal noise to the divided signal. The technology presented provides high frequency operation at meager power levels while overcoming other shortcomings of previous solutions.

BRIEF SUMMARY

A method and apparatus are disclosed for realizing frequency division through utilizing a parametric amplification effect in a capacitive-gap (or capacitive coupling or capacitive transducer) transduced micromechanical resonator while consuming almost negligible power. In actual demonstration, a divide-by-two version of this frequency divider provides not only the 6 dB reduction in close-to-carrier phase noise expected for a frequency divide-by-two function, but also beneficially provides a 23 dB reduction in far-from-carrier noise due to filtering by its extremely high mechanical Q of 91,500. The parametric oscillator frequency divider works in response to modulation of a frequency-determining parameter of a resonator, e.g., electrical stiffness, at twice the resonance frequency of the mechanical resonator. This produces an effect analogous to a child on a swing, where swinging legs modulate frequency (or stiffness), providing gain and enhancement of in-phase resonant motion. When driven with sufficient pump strength, this gain overcomes resonator losses and amplifies the (initially Brownian) motion into steady-state oscillation at the fundamental resonator frequency.

The demonstrated embodiments include micromechanical resonators used singly and in array configurations. The resonators utilize tiny electrode-to-disk gaps that accentuate electrical stiffness nonlinearity for parametric excitation. The divider requires no active devices and thus adds no noise to the signal. Additionally, with power consumption in principle limited only by MEMS resonator loss, power usage is essentially zero (e.g., 25 nW), offering a compelling alternative to much more power hungry digital electronic dividers. The mechanical frequency dividers as described herein are expected to enable exceptionally low-power frequency synthesizers for applications where the operating frequency remains within the tuning range of the MEMS resonator, such as Chip-Scale Atomic Clock (CSAC). Indeed, commercial CSACs presently consume a battery-unfriendly 120 mW, with a substantial portion of this power being utilized by the frequency dividers in their synthesizers. A mechanical frequency divider consuming only 25 nW or less would greatly reduce power consumption, increasing the application range of CSAC to include an enormous number of applications involving mobile devices.

This present disclosure practically eliminates power consumption when performing frequency division, which can lead to greatly lowered power usage for nearly all synchronous electronic devices which require a clock. This includes applications as common-place as cell phones, televisions, and computers; to exotic applications such as chip-scale atomic clocks and gyroscopes.

The frequency range of the disclosed frequency dividers can be widened to accept input signals at more than just the single resonance frequency through a number of methods, one such being DC bias voltage adjustment. In particular, the typical input voltage used to excite this device consists of two components: (1) an AC modulating component that gives rise the parametric gain used here for the frequency dividing effect; and (2) a DC component that sets the output current, but also sets the center frequency of the device. Depending on the mechanical stiffness of the device and the range of DC-bias voltage used, the central frequency tuning range can be several percent, such as a demonstrated 1.1° A tuning at 32 MHz for a beam resonator. Lower frequency resonators, such as comb driven resonators, equipped with parallel-plate tuning electrodes, can be pulled over 10%.

Another way to extend frequency range is to use a filter structure. For example a filter network, having a wider pass band than a single resonator, can be fabricated if mechanical coupling links between multiple individual resonators are chosen to be quarter-wavelength. Once incorporated into a filter, the bandwidth of acceptable inputs in the network widens.

Further aspects of the presented technology will be brought out in the following portions of the specification, wherein the detailed description is for the purpose of fully disclosing preferred embodiments of the technology without placing limitations thereon.

BRIEF DESCRIPTION OF THE SEVERAL VIEWS OF THE DRAWING(S)

The disclosed technology will be more fully understood by reference to the following drawings which are for illustrative purposes only:

DETAILED DESCRIPTION

1. Introduction

The disclosure presents a frequency divider using a parametric amplification effect in a capacitive-gap/coupling/transducer transduced micro-electromechanical system (MEMS) device.

Figure 1:
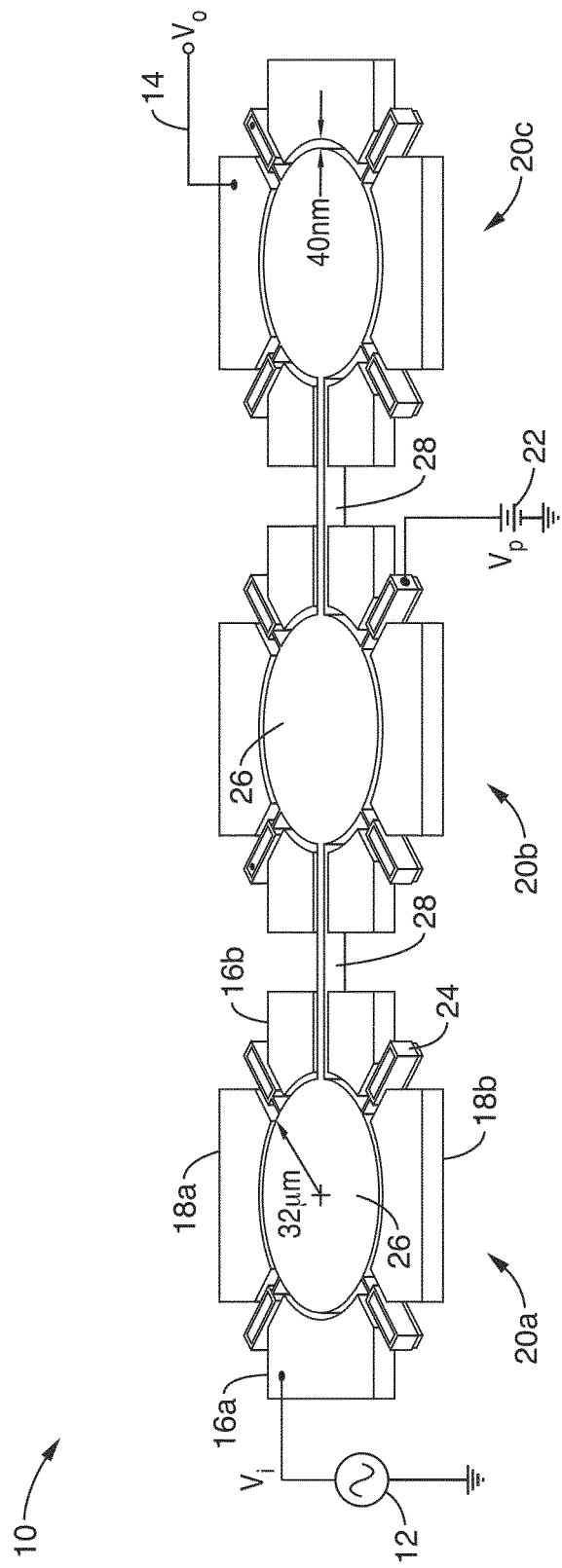
FIG. 1 is a schematic block diagram of a parametric divider according to an embodiment of the present disclosure.

FIG. 1 illustrates an example embodiment 10 of a parametric divider showing 121-MHz pump signal $v_i$ 12 applied to the input electrodes and resultant 60.6-MHz signal on the output electrodes $v_o$ 14. By way of example and not limitation, the resonator structure utilized in this parametric divider comprises an array of wine-glass disks resonators. Each disk structure has input electrodes 16a, 16b, and output electrodes 18a, 18b. It should be appreciated that a typical embodiment includes electrical inter-connection of electrodes disposed on opposing sides of the resonator, such as connecting 16a to 16b, and 18a to 18b. However, it should also be noted that more general connection topologies may be utilized without departing from the teachings of this disclosure.

The disk array contains multiple disks, illustrated here by way of example as three resonator structures 20a, 20b, 20c coupled input-to-input. A voltage $V_P$ is seen applied 22 at an anchor 24 for controlling electrical stiffness in the disks 26 in resonators 20a, 20b, and 20c. In the example embodiments, the anchors are electrically coupled across the array. In an embodiment with all resonator devices electrically connected, the structure can be fabricated in conductive material, and the anchor need not be connected on the substrate, since the structure already makes contact from disk to disk. However, electrical interconnection of all disks to a single $V_P$ is not a requirement of the disclosed teachings; as the resonators in an array of resonators may be electrically isolated and different levels of DC voltage $V_P$ applied. The disks 26 in each of the resonators 20a, 20b and 20c in this example are seen mechanically coupled 28 to one another.

Figure 2A:
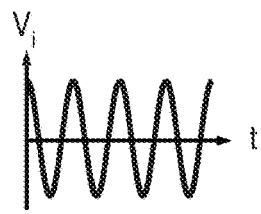
FIG. 2A and FIG. 2B are plots of voltage input and output waveforms for the parametric divider of FIG. 1 according to an embodiment of the present disclosure.
Figure 2B:
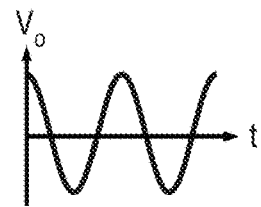

FIG. 2A and FIG. 2B depict input voltage waveform $v_i$ in FIG. 2A, and the respective output $v_o$ in FIG. 2B, for the device seen in FIG. 1.

Figure 3A:
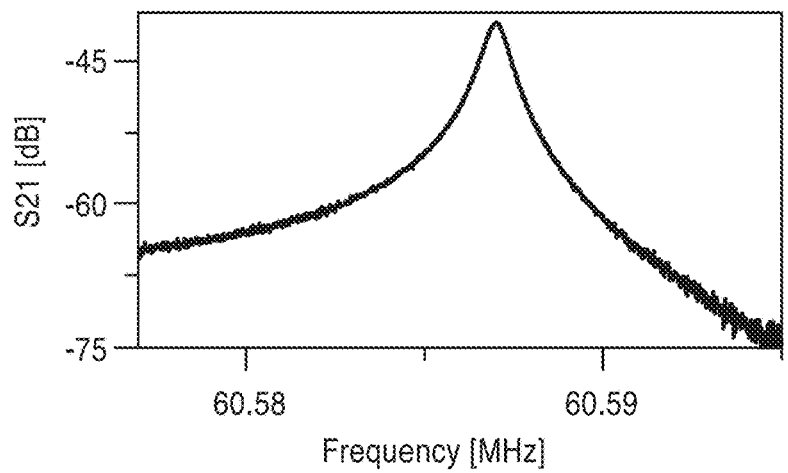
FIG. 3A is a plot of high-Q frequency response for the parametric divider according to an embodiment of the present disclosure.

FIG. 3A depicts the high-Q frequency response of the resonator as measured by two-port transmission with a network analyzer. In this example, the peak is seen at about 60.587 MHz.

Figure 3B:
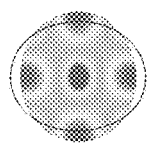
FIG. 3B is an illustration of oscillating mode at peak resonance as seen in FIG. 3A, according to an embodiment of the present disclosure.

FIG. 3B depicts the mechanical mode-shape of a disk at peak resonance seen in FIG. 3A.

Figure 4:
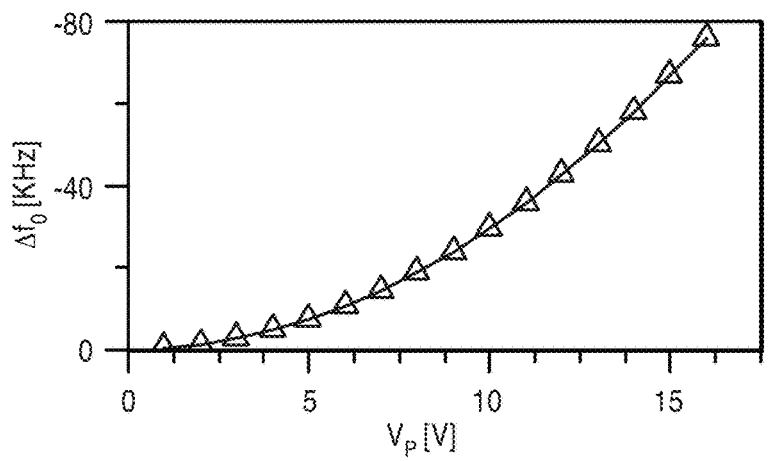
FIG. 4 is a plot of resonance frequency tuning for a parametric divider according to an embodiment of the present disclosure.

FIG. 4 depicts resonance frequency tuning required for parametric amplification through an electrical stiffness effect with applied voltage $V_P$.

Figure 5:
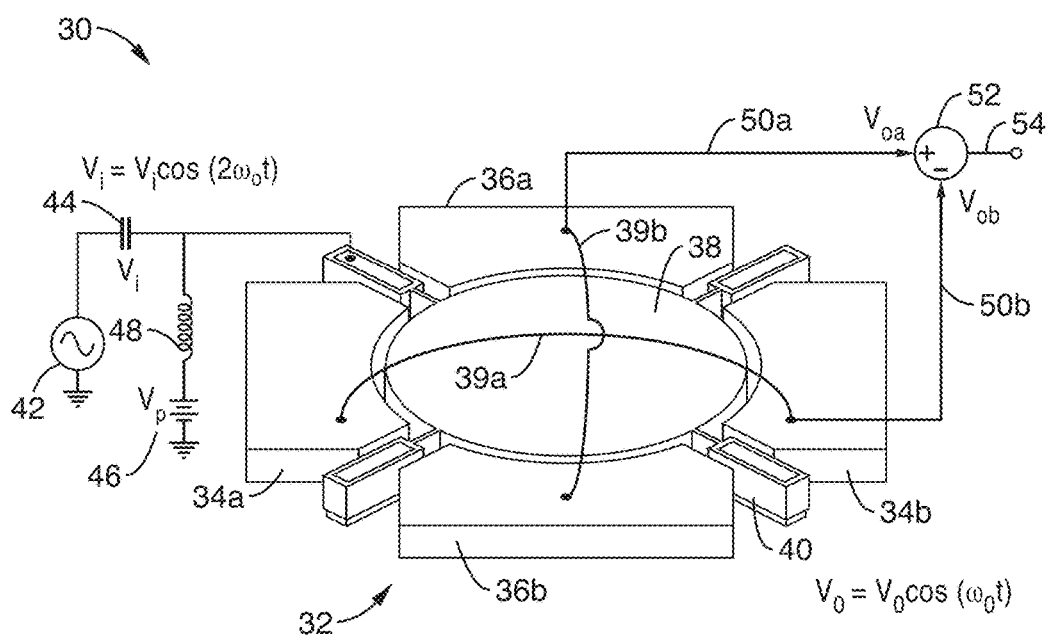
FIG. 5 is a schematic block diagram of a differential frequency mode divider according to an embodiment of the present disclosure.

FIG. 5 illustrates an example embodiment 30 of a stand-alone differential-mode frequency divider used on a single disk 32 in order to boost divided output voltage swing and minimize common-mode harmonic feedthrough. It should be appreciated that these resonators can be arranged in an array format in similar manner as that shown in FIG. 1. Out of phase electrodes 34a, 34b, and in-phase electrodes 36a, 36b, are seen surrounding a floating (e.g., separated from the substrate) disk structure 38 which is only coupled about its periphery by anchors 40 connecting to the substrate. This example depicts an electrical connection 39a between electrodes 34a, 34b, and a similar connection 39b between electrodes 36a, 36b. One of ordinary skill in the art will appreciate that different forms of disk anchoring may be utilized, and in fact a number of different resonator types and geometries may be substituted without departing from the teachings of the present disclosure. Any form of resonator may be utilized with the present disclosure insofar as it includes a capacitive gap, or a capacitive coupling, or a capacitive transducer, or a combination thereof, for transduction or frequency tuning.

An input AC voltage $v_i$ 42 is seen as $v_i = V_i \cos(2\omega_0 t)$ coupled through a series capacitance 44 with capacitor output in parallel with the combination of DC voltage source $V_P$ 46 coupled through a series inductance 48, this combination being coupled to disk at an anchor 40. The output signal is collected as voltage $v_{oa}$ 50a from the in-phase connection 36a, and voltage $v_{ob}$ 50b from the out-of-phase connection 34b. Voltage $v_{ob}$ 50b is subtracted 52 from voltage $v_{oa}$ 50a, to yield output $v_o$ 54, which is given by $v_o = V_o \cos(\omega_0 t)$.

Each of these parametric oscillators operates in response to modulation of a frequency-determining parameter of a resonator, in this case electrical stiffness, at twice the resonance frequency. This produces an effect analogous to a child on a swing, where swinging legs modulate frequency (or stiffness), providing gain and enhancement of in-phase resonant motion that with sufficient pump strength drives the resonator into self-sustained oscillation. While performing a frequency divide-by-two function, the single-ended version of FIG. 1 reduces phase noise by 6 dB at close-to-carrier frequencies and 23 dB far-from-carrier. Building upon this, the differential version of FIG. 5 enables an effective voltage gain, generating a measured output voltage swing of 450 $mV_{pp}$, larger than the input swing of only 445 $mV_{pp}$.

Though similar in operation to injection-locked frequency dividers, the disclosed parametric oscillator requires no active devices, and thus, adds no additional noise sources beyond Brownian noise to the signal. Furthermore, since the power consumption fundamentally comprises only MEMS resonator loss, the power usage approaches zero. This MEMS divider can be expected to enable exceptionally low-power frequency synthesizers for applications where the operating frequency remains within the tuning range of the MEMS resonator, such as the chip-scale atomic clock (CSAC). Indeed, commercial CSACs presently consume a battery-unfriendly 120 mW, with a substantial portion of this power being consumed by the frequency dividers in their synthesizers.

2. Parametric Oscillation

In a parametrically-driven device, an applied pump modulates a frequency-determining "parameter", realized here as the electrical stiffness $k_e$, arising from the applied voltage across the electrode-disk capacitive gaps. This gives rise to the equations of motion:

$$m \frac{\partial^2 r}{\partial t^2} + \frac{m\omega_0}{Q} \frac{\partial r}{\partial t} + [k_0 - k_e(t)]r = F(t) \quad (1)$$

$$k_e(t) = \frac{1}{2} \frac{\partial^2 C_0}{\partial r^2} [V_g(t)]^2 \quad (2)$$

where m is effective resonator mass, r is effective radial resonator displacement at a location of maximum displacement amplitude, $\omega_0$ is the resonance frequency, $k_0$ is the effective mechanical spring constant of the resonator, F(t) is the resonator driving force (in the example disk resonator this comprises only random thermal noise), $C_0$ is the resonator-to-electrode capacitance, and $V_g$ is the total voltage applied across this capacitive gap (or capacitive coupling or capacitive transducer).

Driving $V_g$ with an AC signal $v_i$ at a multiple of, such as twice as per this example, the resonance frequency, together with applying a DC bias voltage $V_P$, generates electrical stiffness $k_e(t) = \Delta k \sin(2\omega_0 t) + k_e^0$ composed of a static shift $k_e^0$ combined with a modulation component at twice the resonance frequency with $\Delta k \propto C_0 V_i V_P$.

Figure 6:
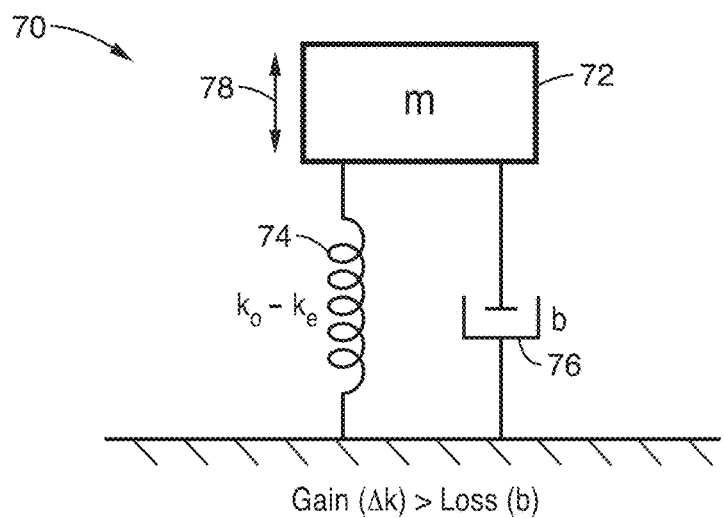
FIG. 6 is a schematic of a theoretical representation of a parametric oscillator utilized according to an embodiment of the present disclosure.

FIG. 6 depicts a theoretical representation 70 of the parametric oscillator divider consisting of a resonator (mass-spring-damper), having mass 72, spring 74 and damper 76, undergoing motion 78 at frequency $\omega_0$.

Figure 7A:
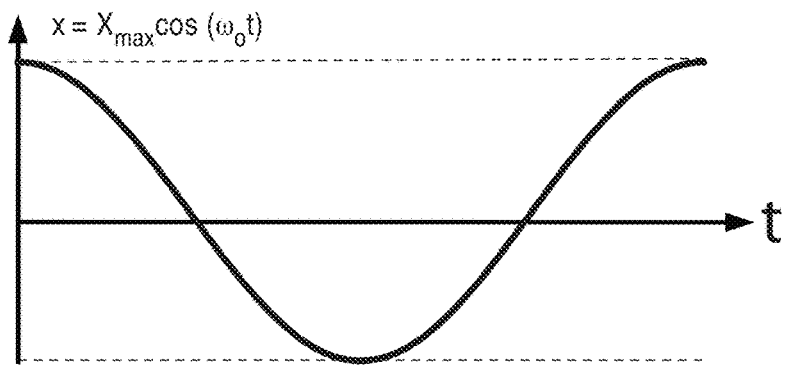
FIG. 7A and FIG. 7B are plots of motion and stiffness of a frequency divider according to an embodiment of the present disclosure.
Figure 7B:
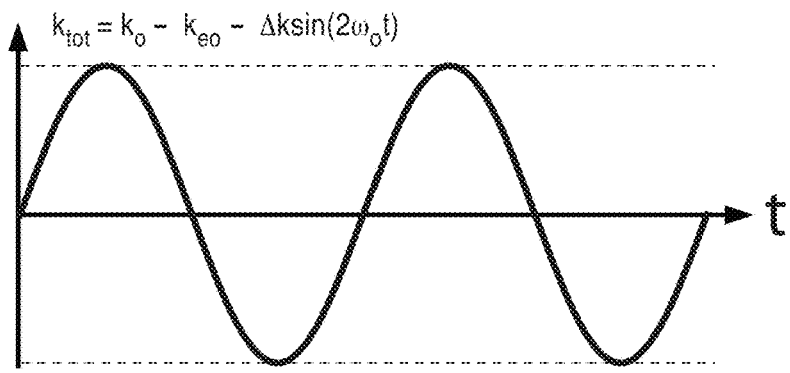

FIG. 7A and FIG. 7B are time domain plots of motion from which one can determine the frequency from the period. FIG. 7A depicts motion at frequency $\omega_0$, seen as $x = X_{max} \cos(\omega_0 t)$. FIG. 7B depicts a stiffness k modulation curve, wherein restoring force is increased following X maxima and decreased near zero, leading to a parametric gain effect on motion.

This modulation as illustrated in FIG. 6, FIG. 7A, and FIG. 7B, leads to a phase-dependent parametric gain of resonant motion. For resonator motion at the correct phase relative to the parametric pump, this can be found to give an amplitude gain of:

$$G = \frac{1}{1 - Q\Delta k / 2k_0} \approx \frac{1}{1 - \Delta f Q / f_0} \quad (3)$$

where $\Delta f$ is the amplitude of frequency shift induced by the modulated stiffness. Although produced entirely by modulation of the resonator frequency, this gain can be understood conceptually as equivalent to a traditional oscillator where resonator motion is amplified in a closed-loop configuration. Recognizing $f_0/Q$ as the 3 dB bandwidth of the resonator and, therefore, equivalent to the resonator damping, makes clear the equivalence of amplifier gain with depth of the applied stiffness modulation. When driven with sufficient pump strength, this gain overcomes resonator losses and amplifies the, initially Brownian, motion into steady-state oscillation at the fundamental resonator frequency, limited only by resonator nonlinearities. It may be seen that Eq. (3) represents a positive feedback equation with loop gain equal to the ratio of frequency pull over 3 dB bandwidth, $A_1 = \Delta f / (f_0/Q)$.

Given the above mechanism for parametric gain, utilization of the disk resonator device as a frequency divider is manifest, wherein an input electrical drive at twice resonance frequency atop a DC-bias voltage $V_P$ produces a parametric gain through modulation of the electrical stiffness of the capacitive gap (or capacitive coupling or capacitive transducer). When sufficient input voltage swing at $2f_0$ is provided, the parametric gain drives the resonator into oscillation at $f_0$, the motion of which, when combined with the bias voltage, generates an output frequency-divided electrical signal.

As the parametric frequency modulation is produced by a time varying voltage applied across a pure capacitance, the lower bound of power required for this drive can, in principle, comprise only the energy transferred to the mechanical resonator. For a steady-state oscillator, this power transfer need only be sufficient to balance resonator losses. With the extremely high Q achievable in MEMS resonators, this energy loss rate is very meager, requiring less than 100 nW to sustain full oscillation amplitude for the Q of 90 k at 61 MHz shown in the example embodiment here 3. Device Design and Operation To optimize utility in modern PLL applications, the MEMS resonators should possess both high operating frequency and the capability to accurately define multiple unique frequencies on the same die, for example their frequencies should be definable in the layout of the die (e.g., CAD layout of the die). To this end, the wine-glass disk resonators depicted in FIG. 1 and FIG. 5 are quite suitable, although the teachings herein are applicable to MEMS resonators having many other structures.

By way of example and not limitation, the embodied devices comprise 2 μm-thick, 32 μm-radius polysilicon disks supported by beams at quasi-nodal points and coupled along their sidewalls to input-output electrodes by tiny 40 nm capacitive gaps. In the three-device array (FIG. 1), coupling beams, sized to correspond to half the acoustic wavelength, force the individual resonators to move in-phase at a single resonance, allowing output current to add constructively to boost electromechanical coupling by the number of individual resonators. To excite the composite resonator into motion, a bias voltage $V_P$ on the disk structure combines with an AC drive voltage applied to all input electrodes to produce forces across the input electrode-to-resonator gaps (or capacitive coupling or capacitive transducer) that, at resonance, excite the wine-glass (i.e., compound (2, 1)) mode shape, shown in FIG. 3B. The frequency of resonance is given by:

$$f_{nom} = \frac{K}{R}\sqrt{\frac{E}{\rho(2+2\sigma)}}\left[1-\frac{k_e}{k_0}\right]^{\frac{1}{2}} \quad (4)$$

where R is the disk radius, K=0.373 for polysilicon structural material, $k_e$ is the electrical stiffness given by Eq. (3), and E, σ, and ρ are the Young's modulus, Poisson ratio, and density of the structural material, respectively.

To exploit the parametric amplification effect for frequency division, the lateral capacitive gap, exemplified as 40 nm, of the device seen in FIG. 1 produces both the strong voltage-dependent frequency tuning, such as seen in FIG. 3A, required for parametric excitation, and with an applied bias voltage, produce an output current proportional to the resonator motion. By enhancing tuning, the small capacitive gaps (or capacitive coupling or capacitive transducer) enable parametric oscillation at UHF frequencies well beyond the kHz range of earlier parametrically amplified sensors, and further allow adjustment of the operating frequency of the divider, as needed for many real-world applications.

4. Noise Filtering

Because of a high mechanical Q value, the MEMS resonator responds with long time constants to changes in the input signal, which in effect filters out noise signals not within its bandwidth. This means that when operated as a self-sustained parametric oscillator, this device removes oscillation perturbations at frequencies greater than the bandwidth of the resonator. The extremely high Q-factor of the MEMS resonator deployed within embodiments described herein produce a pronounced filter cut-off even at frequency offsets below 1 kHz. Combined with the lack of active devices, hence lack of associated noise, the MEMS-based parametric oscillator provides not only divide-by-two frequency division with the expected 6 dB phase noise reduction, but also additional filtering of phase noise outside of the resonator bandwidth. It should be noted that while an effective narrow lock range of the oscillator provides additional filtering, the operating frequency can still be tuned over a much larger range through use of the voltage-controllable electrical stiffness, allowing this device to operate over appreciable bandwidths.

5. Fabrication Example and Testing

Figure 8A:
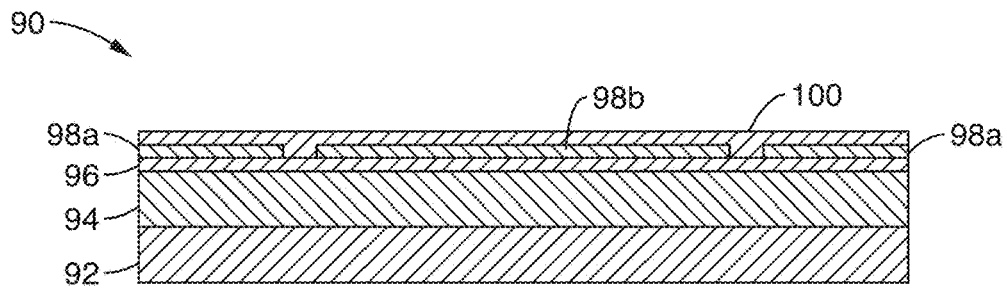
FIG. 8A through FIG. 8D are cross section views of frequency divider fabrication according to an embodiment of the present disclosure.

Utilizing Eq. (4), examples of a single-resonator differential device and 3-resonator single-ended array device (i.e., both utilizing wine-glass disk resonators by way of example) are summarized in Table 1 toward providing divide-by-two functions with 120-MHz input and 60-MHz output. FIG. 8A through FIG. 8D illustrate an example embodiment 90 of a disk resonator fabrication process consisting of repeated thin-film polysilicon and oxide deposition and etching on a silicon substrate. The example fabrication process used for these devices was based on a surface micromachining process summarized in these cross sections. In FIG. 8A there is seen a silicon substrate 92 with its oxide layer 94. A layer of nitride 96 is deposited over the silicon oxide followed by a masked interconnect layer, such as of polysilicon, the interconnect is in layer segments 98a, 98b. Over the interconnect layer is formed a sacrificial oxide layer 100. This first step of FIG. 8A thus indicates achieving an electrical interconnect.

Figure 8B:
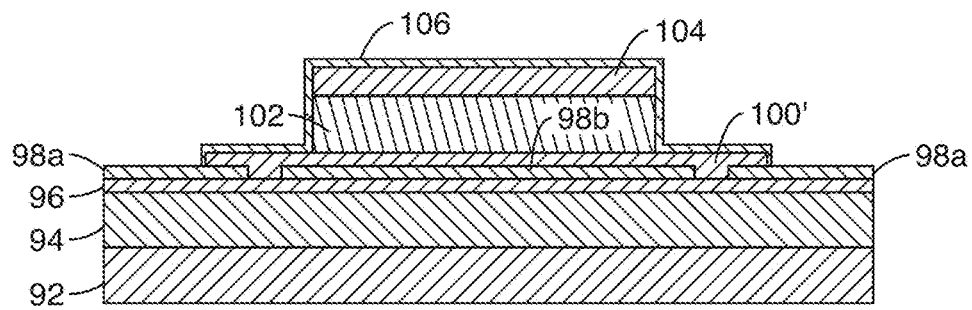
Figure 8C:
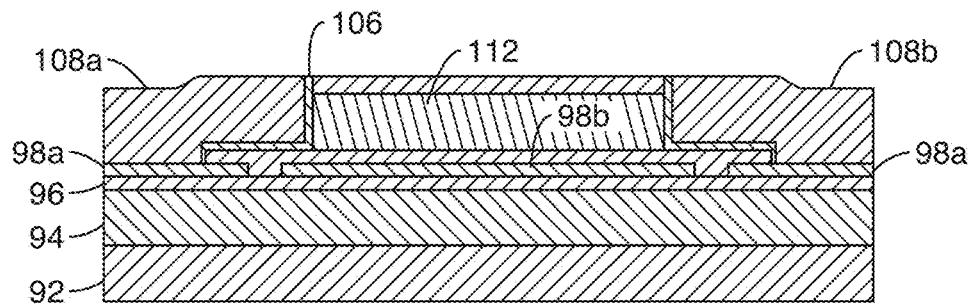
Figure 8D:
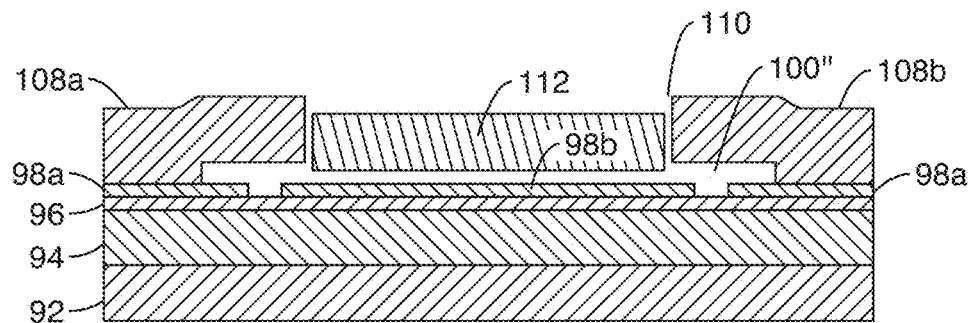

In FIG. 8B subsequent depositions and etching yields a structure layer 102 covered by oxide 104 and a sidewall layer 106 (e.g., 40 nm) covering these elements and over the remaining portion 100' of sacrificial oxide. Additional processing with polysilicon deposition 108a, 108b, patterning and Chemical-Mechanical Polishing (CMP) yields the planarized structure of FIG. 8C. Finally, a wet-etch, such as in 49% HF, yields the released resonator structure of FIG. 8D. It will be noted in this final cross section that sacrificial oxide region 100' has been removed to create a void area 100" thus freeing the underside of the disk. In addition, the sidewall material 106 has been removed leaving a gap 110 freeing the perimeter of the disk 112. It should be appreciated that although the anchors are formed in this process, they are not visible from this cross-section view.

The devices and electrical interconnect were fabricated from polysilicon deposited utilizing Low-Pressure Chemical-Vapor Deposition (LPCVD) at 615° C., in-situ doped with phosphorus. A High-Temperature Oxide (HTO) deposition provided the high-quality sacrificial sidewall spacer that enabled 40 nm electrode-to-resonator gaps. Two CMP steps, one before structural polysilicon deposition and patterning and the other after the electrode polysilicon deposition, provided the planar surfaces needed for precise lithography, as well as removed electrode-disk overhangs that can cause pull-in and device failure at low bias voltages.

Figure 9:
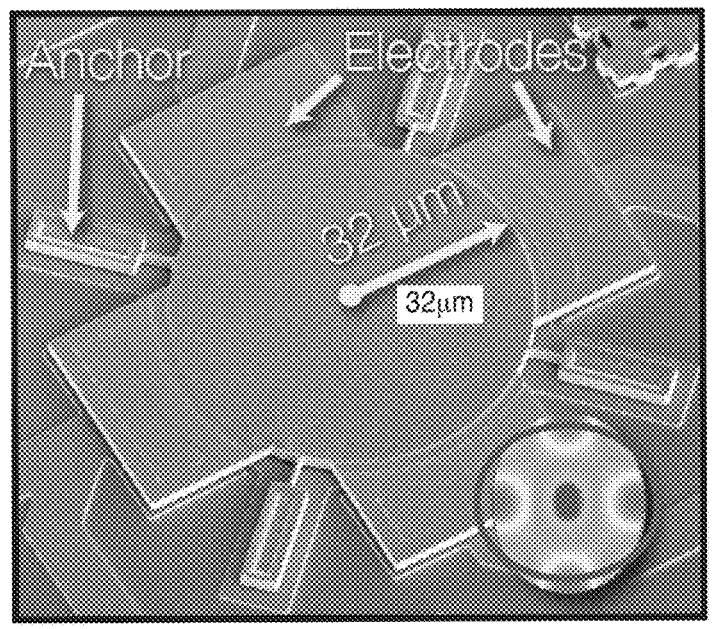
FIG. 9 is an SEM image of a single element frequency divider according to an embodiment of the present disclosure.
Figure 10:
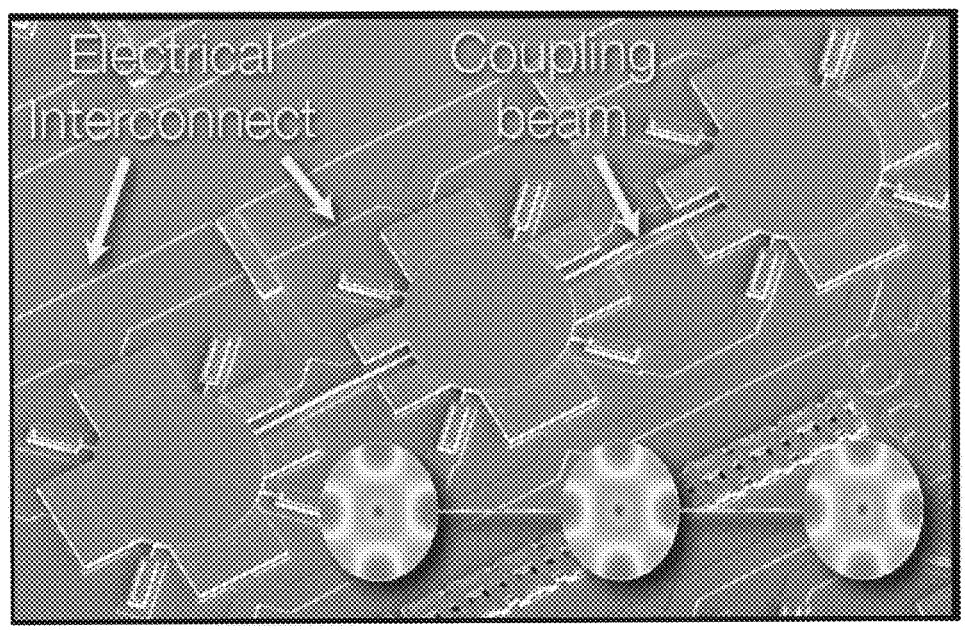
FIG. 10 is an SEM image of a multiple-element frequency divider according to an embodiment of the present disclosure.

FIG. 9 and FIG. 10 illustrates example implementations of released frequency-dividers, similar to that depicted in FIG. 8A through FIG. 8D, shown as scanning electron microscope images (SEMs) along with an inset of FEM simulations depicting oscillation resonance mode shapes. In FIG. 9 the SEM image depicts a single-disk differential device, while in FIG. 10 the SEM image depicts a 3-disk arrayed single-ended divider.

Devices were tested in a Lakeshore® model FWPX vacuum probe station capable of providing 10 µTorr vacuum. A GGB Industries® Picoprobe model 35, modified to operate in the Lakeshore vacuum system, provided accurate divider input and output voltage measurement with minimal signal loading. Phase noise was measured on an Agilent® E5505A phase noise measurement system.

Figure 11:
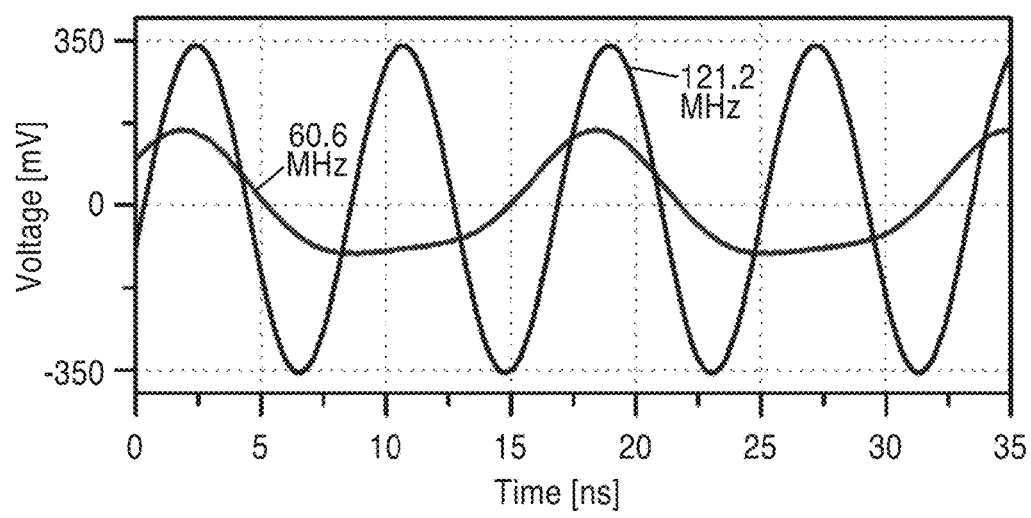
FIG. 11 is a plot of pump waveform and output waveform for a single-ended divider according to an embodiment of the present disclosure.

FIG. 11 depicts an input at 121.174 MHz pump waveform (higher amplitude signal) and a resultant 60.587 MHz output waveform measured on the single-ended divider (three disk element array) of a device as seen in FIG. 1, and shown implemented in FIG. 9. Input and output signals spanned 700 mV$_{pp}$ and 265 mV$_{pp}$, respectively. The distortion seen in these waveforms result from feedthrough of the pump signal.

The resultant 60.587-MHz oscillation combined with a 4 V bias voltage generates a current at the output electrode that drives the modestly large 350 fF output capacitance (composed of bond pad plus Picoprobe capacitance) to a 265 mV$_{pp}$ swing. While the output-to-input voltage ratio is below unity in this configuration due to the large output capacitance, the generated output current would be sufficient to produce an output voltage swing equivalent to input when driving the much smaller 50 fF capacitance of an integrated second MEMS division stage or on-chip buffer.

To achieve an output voltage of similar magnitude as the input even in the face of large bond pad capacitors, the balanced wine-glass disk configuration of FIG. 5, also seen implemented in FIG. 10, using a differential output was also investigated. In this example, driving the pump signal on the disk itself not only enhances the electrical stiffness, which now derives from all electrodes, but also doubles the differential output swing, all while canceling common-mode feedthrough.

Figure 12A:
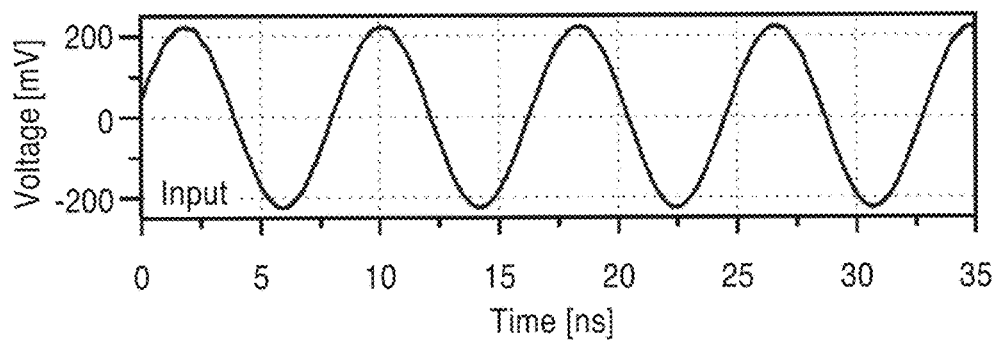
FIG. 12A through FIG. 12C are waveform plots of input, differential output, and combined output, from a single-resonator differential divider according to an embodiment of the present disclosure.
Figure 12B:
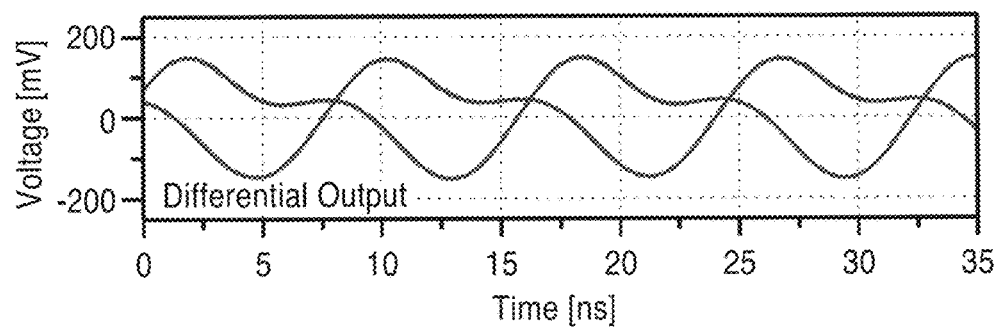
Figure 12C:
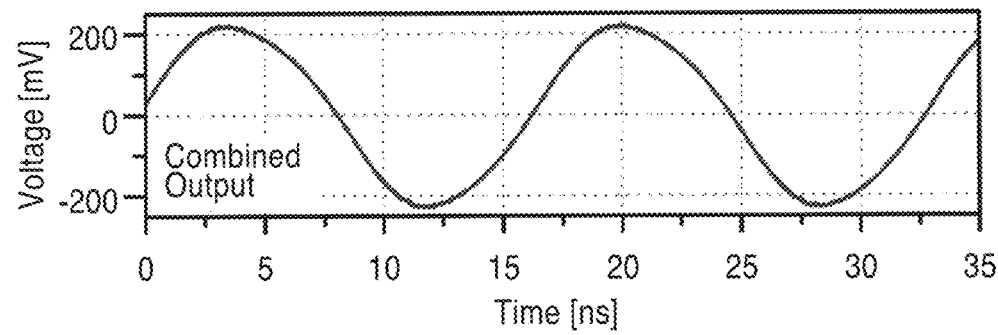

FIG. 12A through FIG. 12C depict waveforms from a single-disk differential measurement, showing a 445 mV$_{pp}$ input pump signal in FIG. 12A, separate differential outputs in FIG. 12B, and a combined differential output of 450 mV$_{pp}$ in FIG. 12C. It will be noted that the resultant output swing seen in FIG. 12C spans 450 mV$_{pp}$ using only a 445 mV$_{pp}$ pump. Thus, voltage gain is provided, as needed for a cascaded divider chain, without need for power-hungry active devices.

Figure 13:
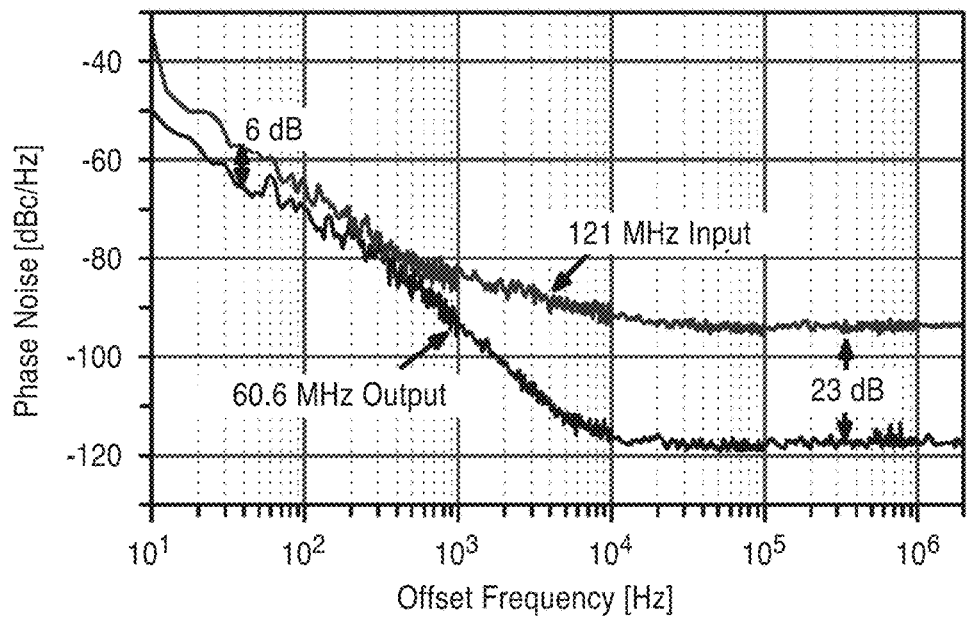
FIG. 13 is a plot of measured single side-band phase noise for an input and output from a frequency divider according to an embodiment of the present disclosure.

FIG. 13 depicts a single side-band phase noise comparison of input pump signal from a low quality voltage controlled oscillator (VCO) operating at 121.2 MHz and resultant 60.6 MHz output of the single-ended divider when driven by a custom-built VCO. Phase noise in the figure shows a typical 6 dB improvement at low frequency. Perhaps more impressively, the high-Q resonator response provides filtering of noise past a 1 kHz offset, leading to a remarkable 23 dB decrease in far-from-carrier phase noise, limited only by the poor 50 nV/rtHz, (rtHz indicating square-root of frequency in Hertz) noise performance of the Picoprobe used to measure the output.

Through use of a parametric amplification effect enabled by the electrical stiffness of capacitive gap (or capacitive coupling or capacitive transducer) MEMS resonators, a new type of frequency divider has been demonstrated. This divider provides both the expected 6 dB phase noise improvement close to carrier for a divide-by-two function as well as additional noise filtering for offsets above 1 kHz due to the high-Q mechanical response function, which provides a unique advantage to this MEMS technology. Consuming a die area of only 100 µm×100 µm for a single 120-MHz divider in demonstrated embodiments, this MEMS-based approach further offers significant space savings over similar CMOS based dividers, where bulky inductors consume 750 µm×320 µm for an operating frequency of 20 GHz, and offer no possibility of division down to typical reference frequencies, e.g., 10 MHz. Adding to the list of benefits, as frequencies increase, this MEMS-based frequency divider shrinks in size. By way of example and not limitation, a 3.4 GHz version would occupy under 30 µm×30 µm of die area. Future efforts to design frequency-matched chains of such MEMS dividers would be expected to enable complete low-power PLL topologies at up into GHz frequencies. Clearly, this device adds a previously missing frequency divider capability to the MEMS toolbox.

The frequency range of the present disclosure can be widened utilizing any of several different methods. One such method is that of adjusting DC bias voltage. It will be noted that the applied voltage consists of two components. A first component is an AC modulating bias voltage that gives rise to parametric gain used here for the frequency dividing effect. A second component is a DC bias component that sets the output current, but also sets the center frequency of the device. Depending on the mechanical stiffness of the device and the range of DC-bias voltage used, the central frequency tuning range can be several percent.

Figure 14:
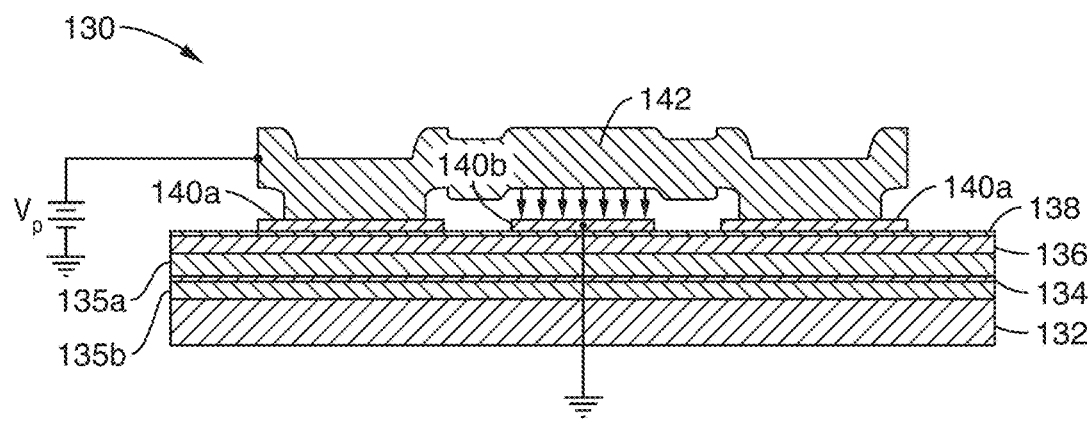
FIG. 14 is a schematic block diagram of a beam resonator as an illustration that other forms of resonators may be utilized in a frequency divider apparatus according to an embodiment of the present disclosure.

FIG. 14 illustrates another form of example resonator 130, depicted as a beam resonator, which demonstrates a 1.1% tuning range at 32 MHz. It should be appreciated, by contrast, that certain comb driven resonators can be pulled over 10%. The beam resonator illustrated is seen fabricated over layers comprising a substrate 132, with several oxide isolation layers 134, 135a, 135b and 136, and a silicon nitride layer 138. Beam 142 is anchored at 140a, and resonates in relation to electrode 140b. This figure illustrates that many other forms of MEMS resonators may be used.

Figure 15:
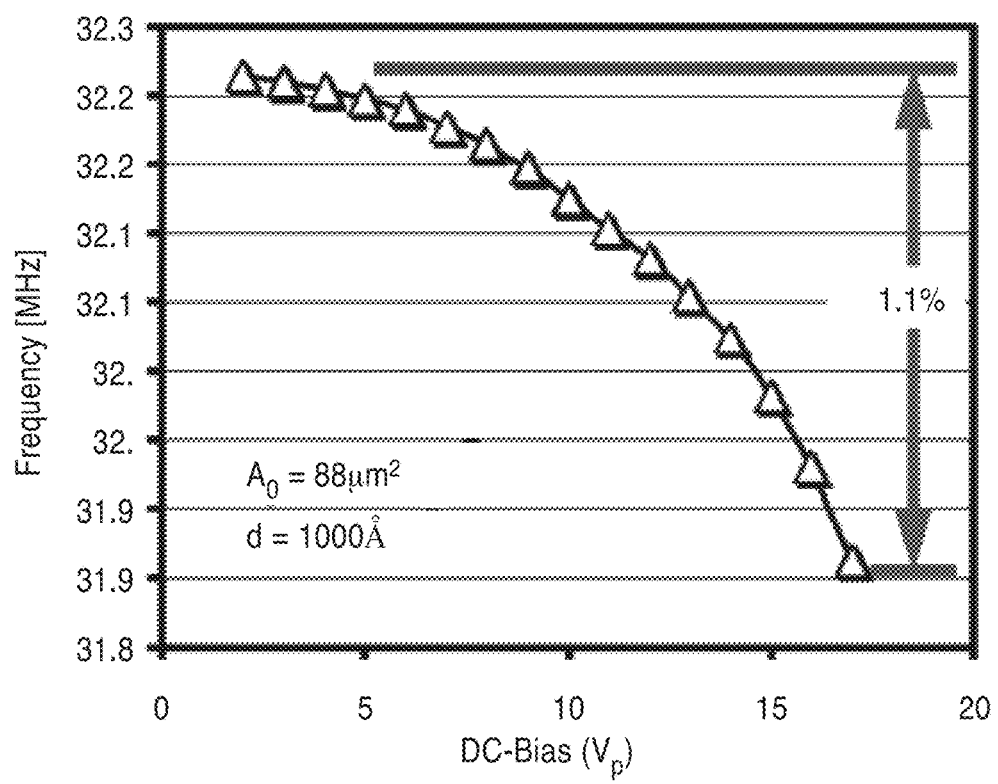
FIG. 15 is a plot of frequency tuning response from a frequency divider utilizing the resonator of FIG. 14, according to an embodiment of the present disclosure.

FIG. 15 depicts the frequency tuning response of the beam resonator device.

One of ordinary skill in the art will appreciate that the methods presented herein are widely applicable to a range of resonator devices which utilize a capacitive gap/coupling/transducer for transduction. Furthermore, the techniques are also applicable to resonators which are not typically actuated through this capacitive gap (e.g., piezo coupled devices), for example those in which a tuning capacitance may be added.

Accordingly, the disclosed teachings are applicable to a range of resonators, given by way of example and not limitation as: ring resonators (both contour mode or others, such as wine-glass ring), Lame mode resonators, bar resonators, flexural beam resonators, membrane or "drum head" resonators, comb-driven flexural-mode resonators with suitable tuning electrodes, center-supported disk resonators (e.g., using both in-plane contour, and whispering gallery modes, or various flexural mode operation), surface acoustic wave (SAW) devices, bulk acoustic wave (BAW) devices, film bulk acoustic resonator (FBAR) devices, lateral over-moded bulk acoustic-wave resonator (LOBAR) devices, or other piezo actuated resonators, provided an additional capacitive coupling is added to enable the described frequency modulation effect. Additionally, internal dielectric actuated resonators may be utilized in any of the above mode shapes, where the needed capacitive coupling is provided by the internal dielectric gap. Similarly, internally-transduced resonators, may be utilized in which the capacitive-gap is formed from a semiconductor junction, as in body-resonator transistors. Still further, the disclosed teachings may be utilized with various combinations of the above devices without departing from the these disclosed teachings.

From the description herein, it will be appreciated that the present disclosure encompasses multiple embodiments which include, but are not limited to, the following:

1. A micro-electromechanical system (MEMS) frequency divider apparatus, comprising: (a) a substrate; (b) at least one MEMS resonator disposed on the substrate, said resonator having a resonant structure configured for mechanical oscillation at a resonance frequency $\omega_0$; and (c) one or more electrodes, disposed on said substrate, or MEMS resonator, that are capacitively coupled to one or more portions of said resonant structure; (d) an input AC voltage coupled to said resonant structure, with frequency at an approximate multiple of said resonance frequency $\omega_0$, that induces mechanical oscillation of said resonant structure to generate an output whose frequency is a division of said input frequency.

2. The apparatus of any preceding embodiment, wherein said division of said input frequency comprises a divide-by-two, so that the output frequency from said apparatus is one-half of said input frequency.

3. The apparatus of any preceding embodiment: wherein said input AC voltage is coupled directly to said resonant structure along with a bias voltage; wherein said one or more electrodes comprise two sense electrodes disposed on said substrate, or MEMS resonator, which are capacitively coupled to said resonant structure of said MEMS resonator; and wherein said apparatus outputs a signal as a differential between signals from these at least two sense electrodes.

4. The apparatus of any preceding embodiment, wherein said apparatus comprises an array divider having at least two resonant structures which are mechanically coupled to one another.

5. The apparatus of any preceding embodiment, wherein said mechanical coupling comprises material, disposed in separation from said substrate, while connecting from the resonant structure in one MEMS resonator to the resonant structure of a subsequent MEMS resonator.

6. The apparatus of any preceding embodiment, wherein at least one drive electrode is disposed on said substrate, or MEMS resonator, which is capacitively coupled to said resonant structure of a first MEMS resonator for driving this first MEMS resonator into mechanical oscillation, which is mechanically carried through consecutively coupled MEMS resonators in the array divider.

7. The apparatus of any preceding embodiment, wherein at least one output electrode is disposed on said substrate which is capacitively coupled to said resonant structure of one of said MEMS resonators in said array divider.

8. The apparatus of any preceding embodiment, wherein said at least one MEMS resonator comprises either a single MEMS resonator, or multiple MEMS resonators with their resonant structures mechanically coupled to one another in an array configuration.

9. The apparatus of any preceding embodiment, wherein said resonant structure of said MEMS resonator comprises a disk resonator, having a central disk surrounded by multiple electrodes retained in close proximity to said central disk.

10. The apparatus of any preceding embodiment, wherein said MEMS resonator comprises a wine glass disk resonator.

11. The apparatus of any preceding embodiment, wherein said resonant structure utilizes a capacitive gap for transduction.

12. The apparatus of any preceding embodiment, further comprising a voltage applied across the resonator to electrode gap for controlling electrical stiffness in performing resonant frequency tuning of the apparatus.

13. The apparatus of any preceding embodiment, further comprising a voltage applied to an anchor of the resonant structure of said MEMS resonator for controlling electrical stiffness in performing resonant frequency tuning of the apparatus.

14. The apparatus of any preceding embodiment, wherein said apparatus is configured for coupling in series with additional stages of said apparatus which subsequently divide down the input frequency further than is provided by a single stage of said apparatus.

15. The apparatus of any preceding embodiment, further comprising widening frequency range of said apparatus in response to applying an adjustable DC bias voltage, or incorporating a filter network having a wider pass band than a single resonator, or utilizing a combination thereof.

16. The apparatus of any preceding embodiment, wherein said apparatus is configured for use in synchronous electronic devices requiring a clock signal.

17. The apparatus of any preceding embodiment, wherein said apparatus is configured for use in a group of synchronous electronic devices consisting of phase-locked loops (PLL), and frequency synthesizers.

18. The apparatus of any preceding embodiment, wherein said MEMS resonator is a MEMS resonator which utilizes a capacitive gap for transduction.

19. The apparatus of any preceding embodiment, wherein said MEMS resonator is selected from a group of resonators consisting of comb-driven resonators, piezo coupled resonators, ring resonators, contour mode ring resonators, wineglass ring resonators, Lame mode resonators, bar resonators, flexural beam resonators, membrane resonators, comb-driven flexural-mode resonators, center-supported disk resonators, surface acoustic wave (SAW) devices, bulk acoustic wave (BAW) devices, film bulk acoustic resonator (FBAR) devices, lateral overmoded bulk acoustic-wave resonator (LOBAR) devices, piezo actuated resonators, internal dielectric actuated resonators, internally-transduced resonators having a capacitive-coupling formed from a semiconductor junction, and combinations thereof.

20. A micro-electromechanical system (MEMS) frequency divider apparatus, comprising: (a) a substrate; (b) a first MEMS resonator disposed above the substrate, the MEMS resonator comprising a resonant structure configured for mechanical oscillation at a resonance frequency $\omega_0$; (c) one or more electrodes, disposed on said substrate, or MEMS resonator, which are capacitively coupled to one or more portions of said resonant structure of said first MEMS resonator; and (d) at least one additional MEMS parametric oscillator comprising a resonant structure configured for mechanical oscillation at a resonance frequency $\omega_0$; (e) wherein said first MEMS resonator and the additional MEMS resonators comprise a divider array with mechanical linkages disposed in separation from said substrate, between said first MEMS resonator and the additional MEMS resonators, whereby vibrations of the first and additional MEMS resonators are mechanically coupled; and (f) wherein an input frequency, at an approximate multiple of said resonance frequency $\omega_0$ coupled to said resonant structure induces mechanical oscillation of said resonant structure which is registered on at least one of said electrodes through said capacitive coupling, to generate an output whose frequency is a division of said input frequency.

21. The apparatus of any preceding embodiment, wherein a differential signal is output as sensed between at least two sense electrodes in said divider array.

22. The apparatus of any preceding embodiment, wherein said division of said input frequency comprises a divide-by-two, whereby output frequency from said apparatus is one-half of said input frequency.

23. The apparatus of any preceding embodiment, further comprising a voltage applied across the resonator to electrode gap for controlling electrical stiffness in performing resonant frequency tuning of the apparatus.

24. The apparatus of any preceding embodiment, further comprising a voltage applied to an anchor of the resonant structure of said MEMS resonator for controlling electrical stiffness in performing resonant frequency tuning of the apparatus.

25. The apparatus of any preceding embodiment, wherein at least one drive electrode is disposed on said substrate, or MEMS resonator, which is capacitively coupled to said resonant structure of said first MEMS resonator for driving this first MEMS resonator into mechanical oscillation, which is mechanically coupled through any additional MEMS resonators which are consecutively coupled in the divider array.

26. The apparatus of any preceding embodiment, wherein said MEMS resonator is a MEMS resonator which utilizes a capacitive gap for transduction.

27. The apparatus of any preceding embodiment, wherein said MEMS resonator is selected from a group of resonators consisting of comb-driven resonators, piezo coupled resonators, ring resonators, contour mode ring resonators, wineglass ring resonators, Lame mode resonators, bar resonators, flexural beam resonators, membrane resonators, comb-driven flexural-mode resonators, center-supported disk resonators, surface acoustic wave (SAW) devices, bulk acoustic wave (BAW) devices, film bulk acoustic resonator (FBAR) devices, lateral overmoded bulk acoustic-wave resonator (LOBAR) devices, piezo actuated resonators, internal dielectric actuated resonators, internally-transduced resonators having a capacitive-coupling formed from a semiconductor junction, and combinations thereof.

28. A method of performing frequency division, comprising: (a) inducing mechanical vibration of a micro-electromechanical system (MEMS) resonator in response to capacitively coupling a drive signal at a first frequency, from a proximal electrode to a resonant structure in said MEMS resonator; (b) wherein said first frequency is approximately a multiple of a resonant frequency of the MEMS resonator; (c) carrying mechanical vibration to another portion of said resonant structure in said MEMS resonator, or to one or more additional MEMS resonators mechanically coupled thereto; and (d) outputting a second frequency, as a division of said first frequency, in response to capacitive coupling from said resonant structure of said MEMS resonator, or one of said additional MEMS resonators mechanically coupled thereto, to one or more proximally disposed electrodes.

Although the description herein contains many details, these should not be construed as limiting the scope of the disclosure but as merely providing illustrations of some of the presently preferred embodiments. Therefore, it will be appreciated that the scope of the disclosure fully encompasses other embodiments which may become obvious to those skilled in the art.

In the claims, reference to an element in the singular is not intended to mean "one and only one" unless explicitly so stated, but rather "one or more." All structural and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

TABLE 1

Example Design Parameters for Fabricated MEMs Dividers

| | Q | Radius [μm] | Gap [μm] | h [μm] | m [ng] | $k_0$ [N/m] |
|---|---|---|---|---|---|---|
| Array Device | 91k | 32 | 40 | 2 | 16.1 | $23.0 \times 10^5$ |
| Differential Device | 84k | 32 | 40 | 2 | 5.37 | $5.37 \times 10^5$ |

| | $C_0$ [fF] | $f_0$ [MHz] | $V_P$ [V] | $v_i$ [mV$_{PP}$] | $v_o$ [mV$_{PP}$] |
|---|---|---|---|---|---|
| Array Device | 106.8 | 60.587 | 4 | 700 | 265 |
| Differential Device | 35.6 | 60.560 | 4 | 445 | 450 |

What is claimed is:

1. A micro-electromechanical system (MEMS) frequency divider apparatus, comprising:
   (a) a substrate;
   (b) at least one MEMS resonator disposed on the substrate, said resonator having a resonant structure configured for mechanical oscillation at a resonance frequency $\omega_0$; and
   (c) one or more electrodes, disposed on said substrate, or MEMS resonator, that are capacitively coupled to one or more portions of said resonant structure;
   (d) wherein an input AC voltage coupled to said resonant structure, with frequency at an approximate multiple of said resonance frequency $\omega_0$, induces mechanical oscillation of said resonant structure to generate an output whose frequency is a division of said input frequency;
   (e) wherein said apparatus comprises an array divider having at least two resonant structures which are mechanically coupled to one another; and
   (f) wherein said mechanical coupling comprises material connecting from the resonant structure in one MEMS resonator to the resonant structure of a subsequent MEMS resonator, which is retained in separation from said substrate by a gap.

2. The apparatus recited in claim 1, wherein at least one drive electrode is disposed on said substrate, or MEMS resonator, which is capacitively coupled to said resonant structure of a first MEMS resonator for driving this first MEMS resonator into mechanical oscillation, which is mechanically carried through consecutively coupled MEMS resonators in the array divider.

3. The apparatus recited in claim 1, wherein at least one output electrode is disposed on said substrate which is capacitively coupled to said resonant structure of one of said MEMS resonators in said array divider.

4. A micro-electromechanical system (MEMS) frequency divider apparatus, comprising:
(a) a substrate;
(b) at least one MEMS resonator disposed on the substrate, said resonator having a resonant structure configured for mechanical oscillation at a resonance frequency $\omega_0$; and
(c) one or more electrodes, disposed on said substrate, or MEMS resonator, that are capacitively coupled to one or more portions of said resonant structure;
(d) wherein an input AC voltage coupled to said resonant structure, with frequency at an approximate multiple of said resonance frequency $\omega_0$, induces mechanical oscillation of said resonant structure to generate an output whose frequency is a division of said input frequency; and
(e) wherein a voltage applied to an anchor of the resonant structure of said MEMS resonator controls electrical stiffness for performing resonant frequency tuning of the apparatus.

5. The apparatus recited in claim 4, wherein said division of said input frequency comprises a divide-by-two, so that the output frequency from said apparatus is one-half of said input frequency.

6. The apparatus recited in claim 4:
wherein said input AC voltage is coupled directly to said resonant structure along with a bias voltage;
wherein said one or more electrodes comprise two sense electrodes disposed on said substrate, or MEMS resonator, which are capacitively coupled to said resonant structure of said MEMS resonator; and
wherein said apparatus outputs a signal as a differential between signals from these at least two sense electrodes.

7. The apparatus recited in claim 4, wherein said at least one MEMS resonator comprises either a single MEMS resonator, or multiple MEMS resonators with their resonant structures mechanically coupled to one another in an array configuration.

8. The apparatus recited in claim 4, wherein said resonant structure of said MEMS resonator comprises a disk resonator, having a central disk surrounded by multiple electrodes retained in close proximity to said central disk.

9. The apparatus recited in claim 8, wherein said MEMS resonator comprises a wine glass disk resonator.

10. The apparatus recited in claim 4, wherein said resonant structure utilizes a capacitive gap for transduction.

11. A micro-electromechanical system (MEMS) frequency divider apparatus, comprising:
(a) a substrate;
(b) at least one MEMS resonator disposed on the substrate, said resonator having a resonant structure configured for mechanical oscillation at a resonance frequency $\omega_0$; and
(c) one or more electrodes, disposed on said substrate, or MEMS resonator, that are capacitively coupled to one or more portions of said resonant structure;
(d) wherein an input AC voltage coupled to said resonant structure, with frequency at an approximate multiple of said resonance frequency $\omega_0$, induces mechanical oscillation of said resonant structure to generate an output whose frequency is a division of said input frequency; and
(e) wherein said apparatus is configured for coupling in series with additional stages of said apparatus which subsequently divide down the input frequency further than is provided by a single stage of said apparatus.

12. A micro-electromechanical system (MEMS) frequency divider apparatus, comprising:
(a) a substrate;
(b) at least one MEMS resonator disposed on the substrate, said resonator having a resonant structure configured for mechanical oscillation at a resonance frequency $\omega_0$; and
(c) one or more electrodes, disposed on said substrate, or MEMS resonator, that are capacitively coupled to one or more portions of said resonant structure;
(d) wherein an input AC voltage coupled to said resonant structure, with frequency at an approximate multiple of said resonance frequency $\omega_0$, induces mechanical oscillation of said resonant structure to generate an output whose frequency is a division of said input frequency; and
(e) wherein frequency range of said apparatus widens in response to applying an adjustable DC bias voltage, or incorporating a filter network having a wider pass band than a single resonator, or utilizing a combination thereof.

13. The apparatus recited in claim 4, wherein said apparatus is configured for use in synchronous electronic devices requiring a clock signal.

14. A micro-electromechanical system (MEMS) frequency divider apparatus, comprising:
(a) a substrate;
(b) at least one MEMS resonator disposed on the substrate, said resonator having a resonant structure configured for mechanical oscillation at a resonance frequency $\omega_0$; and
(c) one or more electrodes, disposed on said substrate, or MEMS resonator, that are capacitively coupled to one or more portions of said resonant structure;
(d) wherein an input AC voltage coupled to said resonant structure, with frequency at an approximate multiple of said resonance frequency $\omega_0$, induces mechanical oscillation of said resonant structure to generate an output whose frequency is a division of said input frequency; and
(e) wherein said apparatus is configured for use in a group of synchronous electronic devices consisting of phase-locked loops (PLL), and frequency synthesizers.

15. The apparatus recited in claim 4, wherein said MEMS resonator is a MEMS resonator which utilizes a capacitive gap for transduction.

16. The apparatus recited in claim 4, wherein said MEMS resonator is selected from a group of resonators consisting of comb-driven resonators, piezo coupled resonators, ring resonators, contour mode ring resonators, wine-glass ring resonators, Lame mode resonators, bar resonators, flexural beam resonators, membrane resonators, comb-driven flexural-mode resonators, center-supported disk resonators, surface acoustic wave (SAW) devices, bulk acoustic wave (BAW) devices, film bulk acoustic resonator (FBAR) devices, lateral overmoded bulk acoustic-wave resonator (LOBAR) devices, piezo actuated resonators, internal dielectric actuated resonators, and internally-transduced resonators having a capacitive coupling formed from a semiconductor junction.

17. A micro-electromechanical system (MEMS) frequency divider apparatus, comprising:
(a) a substrate;
(b) a first MEMS resonator disposed above the substrate, the MEMS resonator comprising a resonant structure configured for mechanical oscillation at a resonance frequency $\omega_0$;

(c) one or more electrodes, disposed on said substrate, or MEMS resonator, which are capacitively coupled to one or more portions of said resonant structure of said first MEMS resonator; and
(d) at least one additional MEMS parametric oscillator comprising a resonant structure configured for mechanical oscillation at a resonance frequency $\omega_0$;
(e) wherein said first MEMS resonator and the additional MEMS resonators comprise a divider array with mechanical linkages disposed in separation from said substrate, between said first MEMS resonator and the additional MEMS resonators, whereby vibrations of the first and additional MEMS resonators are mechanically coupled; and
(f) wherein an input frequency, at an approximate multiple of said resonance frequency $\omega_0$ coupled to said resonant structure induces mechanical oscillation of said resonant structure which is registered on at least one of said electrodes through said capacitive coupling, to generate an output whose frequency is a division of said input frequency.

18. The apparatus recited in claim 17, wherein a differential signal is output as sensed between at least two sense electrodes in said divider array.

19. The apparatus recited in claim 17, wherein said division of said input frequency comprises a divide-by-two, whereby output frequency from said apparatus is one-half of said input frequency.

20. The apparatus recited in claim 17, wherein a voltage applied across the resonator to electrode gap controls electrical stiffness for performing resonant frequency tuning of the apparatus.

21. The apparatus recited in claim 17, wherein a voltage applied to an anchor of the resonant structure of said MEMS resonator controls electrical stiffness for performing resonant frequency tuning of the apparatus.

22. The apparatus recited in claim 17, wherein at least one drive electrode is disposed on said substrate, or MEMS resonator, which is capacitively coupled to said resonant structure of said first MEMS resonator for driving this first MEMS resonator into mechanical oscillation, which is mechanically coupled through any additional MEMS resonators which are consecutively coupled in the divider array.

23. The apparatus recited in claim 17, wherein said MEMS resonator is a MEMS resonator which utilizes a capacitive gap for transduction.

24. The apparatus recited in claim 17, wherein said MEMS resonator is selected from a group of resonators consisting of comb-driven resonators, piezo coupled resonators, ring resonators, contour mode ring resonators, wineglass ring resonators, Lame mode resonators, bar resonators, flexural beam resonators, membrane resonators, comb-driven flexural-mode resonators, center-supported disk resonators, surface acoustic wave (SAW) devices, bulk acoustic wave (BAW) devices, film bulk acoustic resonator (FBAR) devices, lateral overmoded bulk acoustic-wave resonator (LOBAR) devices, piezo actuated resonators, internal dielectric actuated resonators, and internally-transduced resonators having a capacitive coupled formed from a semiconductor junction.

\* \* \* \* \*